United States Patent
Wu et al.

(10) Patent No.: US 6,583,926 B1
(45) Date of Patent: Jun. 24, 2003

(54) OPTICAL AMPLIFIERS WITH AGE-BASED PUMP CURRENT LIMITERS

(75) Inventors: Yongan Wu, San Jose, CA (US); Jun Ye, Palo Alto, CA (US)

(73) Assignee: Onetta, Inc., Sunnyvale, CA (US)

( * ) Notice: Subject to any disclaimer, the term of this patent is extended or adjusted under 35 U.S.C. 154(b) by 0 days.

(21) Appl. No.: 09/993,946

(22) Filed: Nov. 27, 2001

Related U.S. Application Data

(60) Provisional application No. 60/313,458, filed on Aug. 21, 2001.

(51) Int. Cl.⁷ .............................. H04B 10/12; H01S 3/00
(52) U.S. Cl. ................. 359/341.4; 359/337; 372/38.01; 372/38.02; 372/38.07
(58) Field of Search .......................... 372/38.1, 38.02, 372/38.07; 359/341.4, 337

(56) References Cited

U.S. PATENT DOCUMENTS

| | | | |
|---|---|---|---|
| 4,745,612 A | | 5/1988 | Hayakawa et al. ............ 372/45 |
| 5,019,769 A | * | 5/1991 | Levinson ..................... 372/31 |
| 5,189,679 A | | 2/1993 | Derry et al. .................. 372/45 |
| 5,208,183 A | | 5/1993 | Chen et al. ................. 437/129 |
| 5,218,613 A | | 6/1993 | Serreze ........................ 372/45 |
| 5,287,377 A | | 2/1994 | Fukuzawa et al. ............ 372/45 |
| 5,345,456 A | | 9/1994 | Dai et al. ..................... 372/22 |
| 5,374,973 A | * | 12/1994 | Maxham et al. ......... 359/341.4 |
| 5,430,759 A | | 7/1995 | Yokev et al. ............... 375/202 |
| 5,594,748 A | * | 1/1997 | Jabr ............................ 372/38 |
| 5,946,129 A | | 8/1999 | Xu et al. .................... 359/332 |
| 6,014,235 A | | 1/2000 | Norte ......................... 359/109 |
| 6,028,875 A | | 2/2000 | Knight et al. ................. 372/46 |
| 6,052,222 A | | 4/2000 | Kitamura .................... 359/344 |
| 6,122,306 A | | 9/2000 | Sartorious et al. ............ 372/96 |
| 6,141,477 A | | 10/2000 | Kitamura .................... 385/313 |
| 6,144,684 A | * | 11/2000 | McMinn et al. .............. 372/50 |
| 6,192,058 B1 | | 2/2001 | Abeles .......................... 372/6 |
| 6,215,805 B1 | | 4/2001 | Sartorious et al. ............ 372/50 |
| 6,407,854 B1 | * | 6/2002 | Shum .................... 359/341.41 |
| 2002/0141461 A1 | * | 10/2002 | Liu ......................... 372/29.01 |

OTHER PUBLICATIONS

Fitel Technologies, Inc. "Fully digitized MPU Controlled EDFA", Data Sheet ErFA 3300 Series, Feb. 2000.*

(List continued on next page.)

*Primary Examiner*—Thomas G. Black
*Assistant Examiner*—Andrew R. Sommer
(74) *Attorney, Agent, or Firm*—G. Victor Treyz

(57) ABSTRACT

Optical amplifiers and other optical network equipment for handling optical data signals in fiber-optic communications links are provided. Optical fiber that is pumped by laser diode pumps is used to provide optical gain. The laser diode pumps may be based on laser diode devices that do not have temperature controllers and integral back facet monitors. A control unit may be used to keep track of the age of the laser diode pumps. Information on the age of the pumps may be used to determine the maximum allowable drive current for driving the pumps. Information on the age of the pumps may also be used to select an appropriate drive current level during operation of the pumps.

20 Claims, 6 Drawing Sheets

OTHER PUBLICATIONS

Agere Systems "1724–Type Erbium–Doped Fiber Amplifier Evaluation Software Program", Technical Note Apr. 1998.*

Silver et al. "Design and ASE Characteristics of 1550–nm Polarization Insensitive Semiconductor Optical Amplifiers Containing Tensile and Compressive Wells" IEEE Journal of Quantum Electronics, vol. 36, No. 1, p. 118–122, Jan., 2000.

Ryu et al. "Fabrication and Analysis of Polarization Insensitive 1.55$\mu$m InGaAsP/InP Quantum Well Semiconductor Optical Amplifiers" p. 642, 9/98.

Liu et al. "A Study on the Polarization Sensitive Performance of the Strained Quantum Well Semiconductor Optical Amplifiers." SPIE vol. 3896, p. 494–498 Nov., Dec., 1999.

Schimpe et al. "Compact 2×2 Switch with Optical Amplifier Gates" CLEO, 1994, p. 77.

Kitamura et al. "Angled Facet S–Bend Semiconductor Optical Amplifiers for High–Gain and Large–Extinction Ratio" IEEE Photonics Technology Letters, vol. 11, No. 7 (Jul., 1999).

Saini et al. "Lossless 1×2 Optical Switch Monolithically Integrated on a Passive Active Resonant Coupler (PARC) Platform" IEEE Photonics Technology Letters, vol. 12, No. 7, Jul. 2000.

* cited by examiner

OPTICAL AMPLIFIERS WITH AGE-BASED PUMP CURRENT LIMITERS

This application claims the benefit of provisional patent application No. 60/313,458, filed Aug. 21, 2001.

BACKGROUND OF THE INVENTION

The present invention relates to fiber-optic communications networks, and more particularly, to optical amplifiers and other network equipment for optical communications networks having pump current limiting features.

Fiber-optic networks are used to support voice and data communications. In optical networks that use wavelength division multiplexing, multiple wavelengths of light are used to support multiple communications channels on a single fiber.

Optical amplifiers are used in fiber-optic networks to amplify optical signals. For example, optical amplifiers may be used to amplify optical data signals that have been subject to attenuation over fiber-optic paths. A typical amplifier may include erbium-doped fiber coils that are pumped with diode lasers. Raman amplifiers have also been investigated. Discrete Raman amplifiers may use coils of dispersion-compensating fiber to provide Raman gain. Distributed Raman amplifiers provide gain in the transmission fiber spans that are used to carry optical data signals between network nodes. Diode lasers may be used as Raman pumps for Raman amplifiers.

The diode lasers used as pumps in erbium-doped fiber amplifiers and Raman amplifiers have a maximum power capacity. If such lasers are driven too strongly, the maximum power capacity will be exceeded and the lasers will be damaged. In some amplifiers, lasers have been provided with back facet monitors to make real-time output power measurements. These measurements can be used to limit the maximum output powers of the lasers. Using back facet monitoring may not, always be desirable, however, due to challenges associated with achieving high measurement accuracy, low cost, and low complexity.

It is an object of the present invention to provide improved optical network equipment such as optical amplifiers in which laser diode pumps are operated at levels below those that might damage the pumps.

It is also an object of the present invention to provide optical network equipment such as optical amplifiers in which information on the ages of the pumps is used to estimate the maximum allowable drive current for the pumps.

SUMMARY OF THE INVENTION

These and other objects of the invention are accomplished in accordance with the present invention by providing optical amplifiers and other optical network equipment for use in fiber-optic communications links in fiber-optic networks. The fiber-optic links may be used to carry optical data signals associated with wavelength-division-multiplexing channels. The equipment may provide optical gain for the optical signals.

The optical gain may be provided by pumping fiber with laser diode pumps. Control units in the equipment may be used to keep track of pump age. As time elapses, the control unit may use information on age of the pumps to determine the maximum allowable drive currents for the pumps. The pumps may be driven as needed to produce desired currents, output powers, or gains in the equipment, provided that the maximum allowable drive currents are not exceeded. Pump age information may also be used in calibrating the operating currents for the lasers.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
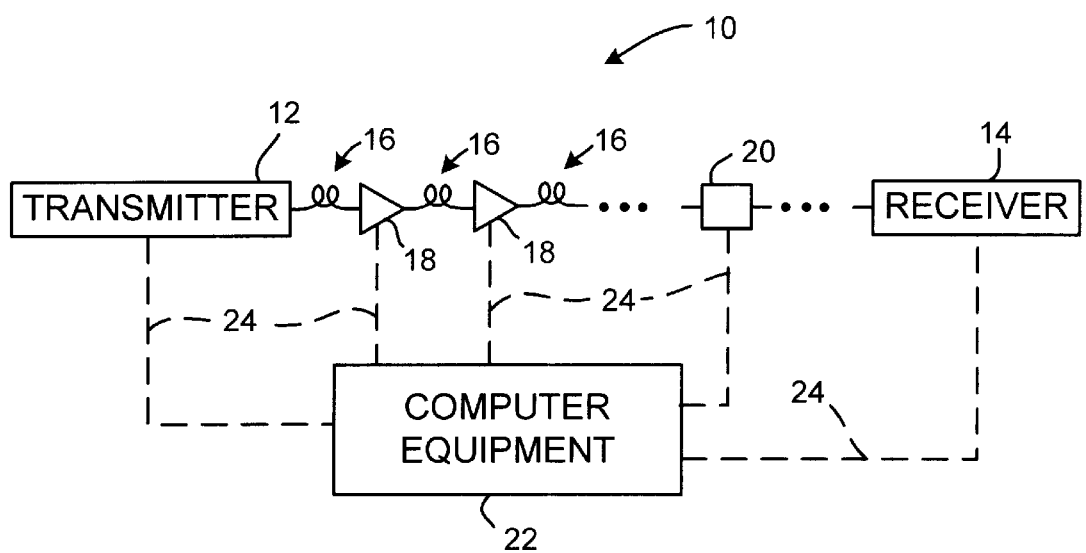
FIG. 1 is a schematic diagram of an illustrative fiber-optic communications link in accordance with the present invention FIG.

An illustrative fiber-optic communications link 10 in an optical communications network in accordance with the present invention is shown in FIG. 1. A transmitter 12 may transmit information to a receiver 14 over a series of fiber links. Each fiber link may include a span 16 of optical transmission fiber. Fiber spans 16 may be on the order of 40–160 km in length for long-haul networks or may be any other suitable length for use in signal transmission in an optical communications network. Link 10 may be a point-to-point link, part of a fiber ring network, or part of any other suitable network or system.

The communications link of FIG. 1 may be used to support wavelength division multiplexing arrangements in which multiple communications channels are provided using multiple wavelengths of light. For example, the link of FIG. 1 may support a system with 40 channels, each using a different optical carrier wavelength. Optical channels may be modulated at, for example, approximately 10 Gbps (OC-192). The carrier wavelengths that are used may be in the vicinity of 1527–1605 nm. These are merely illustrative system characteristics. If desired, fewer channels may be provided (e.g., one channel), more channels may be provided (e.g., hundreds of channels), signals may be carried on multiple wavelengths, signals may be modulated at slower or faster data rates (e.g., at approximately 2.5 Gbps for OC-48 or at approximately 40 Gbps for OC-768), and different carrier wavelengths may be supported (e.g., individual wavelengths or sets of wavelengths in the range of 1240–1670 nm).

Optical amplifiers 18 may be used to amplify optical signals on link 10. Optical amplifiers 18 may include booster amplifiers, in-line amplifiers, and preamplifiers. Optical amplifiers 18 may be rare-earth-doped fiber amplifiers such as erbium-doped fiber amplifiers, amplifiers that include discrete Raman-pumped coils, amplifiers that include pumps for optically pumping spans of transmission fiber 16 to create optical gain through stimulated Raman scattering, or any other suitable optical amplifiers.

Link 10 may include optical network equipment such as transmitter 12, receiver 14, and amplifiers 18 and other optical network equipment 20 such as dispersion compensation modules, dynamic filter modules, add/drop multiplexers, optical channel monitor modules, Raman pump modules, optical switches, etc. For clarity, aspects of the present invention will be described primarily in the context of optical network equipment 20 having gain stages such as optical amplifiers 18. This is, however, merely illustrative. The features of the present invention may be used for any suitable optical network equipment having laser diodes (or semiconductor optical amplifiers based on laser-diode-type structures) if desired.

Computer equipment 22 may be used to implement a network management system. Computer equipment such as computer equipment 22 may include one or more computers or controllers and may be located at network nodes and one or more network management facilities. As indicated by lines 24, the network management system may communicate with optical amplifiers 18, transmitter 12, receiver 14 and other optical network equipment 20 using suitable communications paths. The communications paths may be based on any suitable optical or electrical paths. For example, communications paths 24 may include service or telemetry channel paths implemented using spans 16, may include wired or wireless communications paths, may involve communications paths formed by slowly modulating the normal data channels on link 10 at small modulation depths, etc. Paths 24 may also be used for direct communications between amplifiers 18 and other optical network equipment.

The network management system may be used to control the mode of operation of amplifiers 18 and the settings of amplifiers 18. Amplifiers 18 may support modes of operation such as a constant current mode, a constant output power mode, and a constant gain mode. In the constant current mode, an amplifier may be operated at a particular set of laser diode pump drive currents (e.g., 100 mA for one pump in the amplifier and 130 mA for another, etc.). In the constant output power mode, an optical monitor may be used to measure the output power of the amplifier. Feedback control techniques may be used to adjust the pump power as needed to maintain the measured output power at the desired level. In constant gain mode, the amplifier may adjust the pump powers as needed to maintain the measured gain at a desired level. The network management system may be used to provide desired current settings, output power settings, and gain settings for the amplifier. Mode selection and operating settings may also be provided to optical amplifiers manually or using local control schemes.

Figure 2:
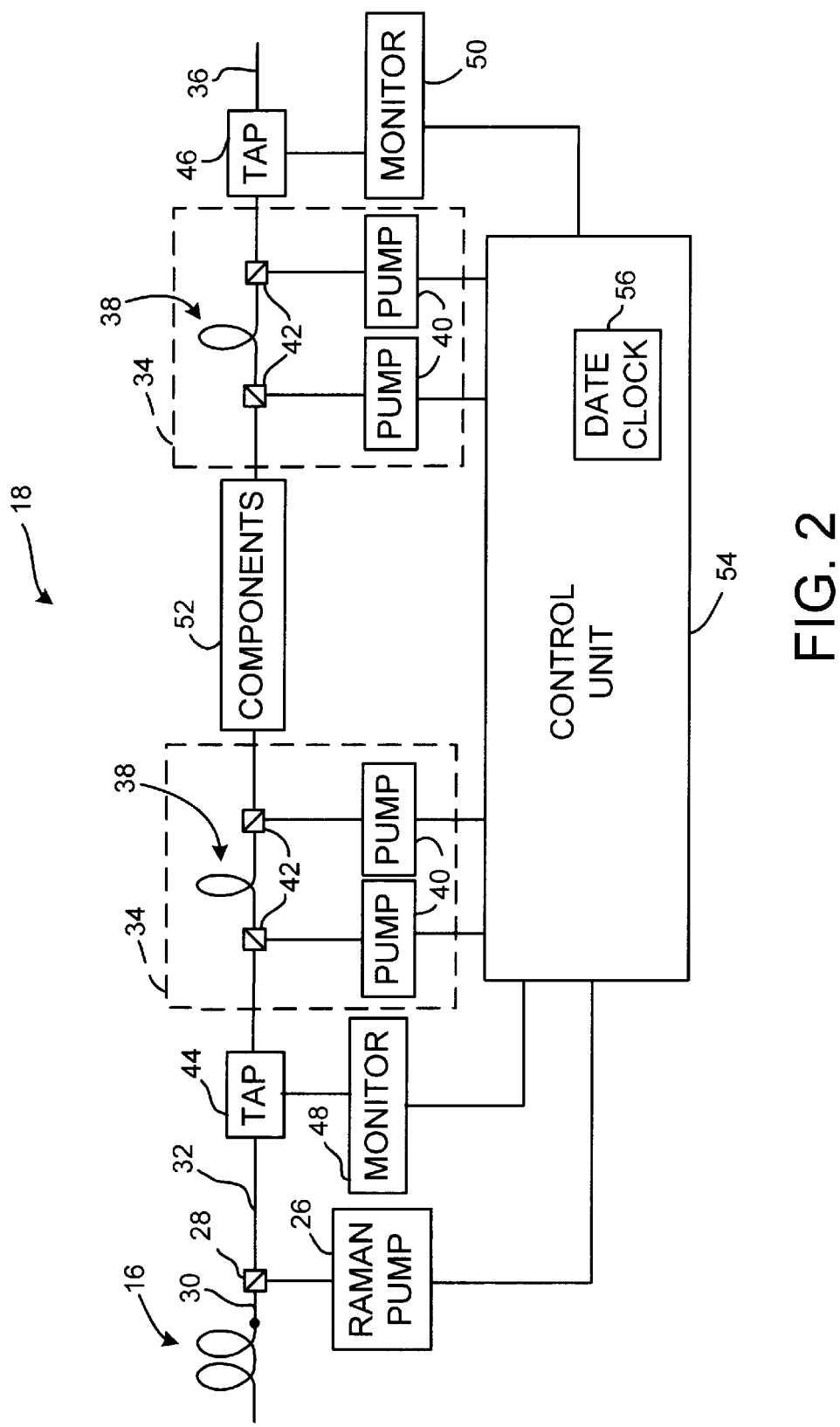
FIG. 2 is a schematic diagram of an illustrative optical amplifier in accordance with the present invention.

An illustrative optical amplifier 18 is shown in FIG. 2. In the example of FIG. 2, Raman pump light may be provided by Raman pump 26. The light from pump 26 may be coupled into transmission fiber span 16 using pump coupler 28. Pump coupler 28 may be a wavelength division multiplexing coupler or any other suitable pump coupler.

Optical data signals from fiber span 16 may be provided to input fiber 30. These signals may pass through coupler 28 to fiber 32. Fiber 32 may be used as an input to the optically-pumped fiber amplifier portion made up of gain stages 34. Optical data signals that have been amplified by the amplifier formed from gain stages 34 may be provided to the next span 16 in link 10 using output fiber 36.

Gain stages 34 may include one or more coils of fiber 38. Fiber 38 may be rare-earth-doped fiber such as erbium-doped fiber or may be fiber that is pumped with Raman pump light (typically a Stokes shift in wavelength below the signal band) to produce Raman gain. Suitable pump wavelengths when fiber 38 is erbium-doped fiber include 980 nm and 1480 nm. Any suitable pump wavelengths may be used if desired.

Pump light for fiber 38 may be provided by pumps 40. Pumps 40 may each include one or more laser diode pumps. Pump light from pumps 40 may be coupled into fiber 38 using pump couplers such as pump couplers 42. The illustrative arrangement of FIG. 2 uses both copumping and counterpumping and uses two gain stages 34. This is merely illustrative. Any suitable number of gain stages 34 may be used. For example, one, two, three, or more than three gain stages 34 may be used. The stages may be only copumped, only counterpumped, or both copumped and counterpumped.

Optical taps such as taps 44 and 46 and corresponding optical monitors 48 and 50 may be used to measure the power at various locations along the main fiber path through amplifier 18. In the example of FIG. 2, tap 44 and monitor 48 may be used to measure the input power to the amplifier portion made up of gain stages 34. Tap 46 and monitor 50 may be used to measure the output power the amplifier.

Taps such as taps 44 and 46 may be wavelength-insensitive 2%/98% taps or any other suitable optical taps. Optical monitors 48 and 50 may include photodetectors for converting tapped light signals into electrical current signals and transimpedance amplifiers for converting the electrical current signals into voltage signals that may be digitized using analog-to-digital converter circuitry in control unit 54 or used by analog control circuitry in control unit 54. These are merely illustrative examples. Any suitable optical monitoring arrangement may be used for amplifier 18 if desired.

Various additional components 52 may be positioned as shown in FIG. 2 and at other locations along the main fiber path through an amplifier 18. These components may include isolators, taps and photodetectors for optical monitoring, filters (e.g., dynamic and static spectral filters), wavelength-division-multiplexing couplers, attenuators, dispersion-compensating elements such as dispersion-compensating fiber, gain stages, pumps, pump couplers, optical channel monitors, optical switches, etc. The operation of the components and gain stages 34 and Raman pump 26 may be controlled using one or more control units such as control unit 54.

Control unit 54 may be based on any suitable control circuitry and may include one or more microprocessors, microcontrollers, digital signal processors, field-programmable gate arrays or other programmable logic devices, application-specific integrated circuits, digital-to-analog converters, analog-to-digital converters, analog control circuits, memory devices, etc. Control unit 54 may include communications circuitry that supports the communications between control unit 54 and computer equipment such as computer equipment 22 of FIG. 1 or other equipment in the network.

Amplifier 18 may be based on an optical network card and may use the communications circuitry to communicate with a controller mounted in a rack in which the card is mounted. The controller may be part of computer equipment 22 or may communicate with computer equipment 22. If desired, amplifier 18 may be implemented as a module that is part of an optical network card. The module may use the communications circuitry in unit 54 to communicate with a controller or other computer equipment 22 or to communicate with additional communications circuitry on the card that in turn supports communications with a controller or other computer equipment 22 in the network. These are merely illustrative communications arrangements that may be used to allow amplifier 18 to communicate with the equipment in the network. Any suitable arrangement may be used if desired.

With the amplifier arrangement of FIG. 2, the output power or gain of amplifier 18 may be controlled by using control unit 54 to adjust pumps 40. Pumps 40 may also be driven at desired current levels. Control unit 54 (or a separate control unit) may be used to adjust Raman pump 26 (e.g., to produce a desired output power at the end of span 16 or to produce a desired gain in span 16). Control unit 54 may also operate individual laser diodes within pump 26 at desired current levels.

If desired, tap 44 and.monitor 48 may be used to measure the total input power of the signals received at input 32. Tap 46 and monitor 50 may be used to measure the total output power of the amplifier at output 36. Control unit 54 may use the input and output power measurements from taps and monitors in the amplifier to suppress gain transients. Such gain transients may arise from sudden changes in the number of channels present on link 10 (e.g., due to a network reconfiguration or an accidental fiber cut). When signal and gain fluctuations are detected using the taps and monitors, control unit 54 may control the power of the pump light produced by the pumps in gain stages 34 to ensure that the gain or output power of the amplifier remains constant.

During amplifier operations that involve pump control, control unit 54 may ensure that the drive current for any given laser diode pump laser does not exceed the maximum allowable drive current for that laser. The maximum allowable drive current is the current that is used to produce the maximum allowable output power. For a given laser diode design, the maximum allowable output power is essentially fixed. However, as the laser diode ages, the amount of current needed to produce an output power equal to the maximum allowable output power changes. Control unit 54 may use date clock 56 (or date or age information provided from an external source such as the network management system) to monitor the age of the laser diodes used for pumps 26 and 40. As each pump ages, control unit 54 may allow that pump to be pumped slightly more without exceeding the maximum allowable output power level for that pump.

Date clock 56 may be implemented using any suitable combination of software and hardware. For example, date clock 56 may be implemented by using a microprocessor driven by a hardware clock to update a portion of memory in control unit 54 each day (or other increment) to reflect the current age of the amplifier.

The age of the pumps may be represented using a true age (measured, for example, using an absolute date clock or a relative time measurement from the time the pumps are put into use or other suitable start time) or may be represented by the amount of time that the pumps are in actual use. Age measurements based on the amount of time the pumps are in use may be made, for example, by suspending the operation of the date clock whenever the pumps are turned off or are only being lightly used. If desired, the effects of accelerated aging may be taken into account by incrementing the date clock more rapidly when the pumps are being operated at particularly high powers.

These are merely illustrative examples. Any suitable arrangement (internal or external) may be used by control unit 54 to keep track of the age of amplifier 18 and pumps such as pumps 26 and 40.

Figure 3:
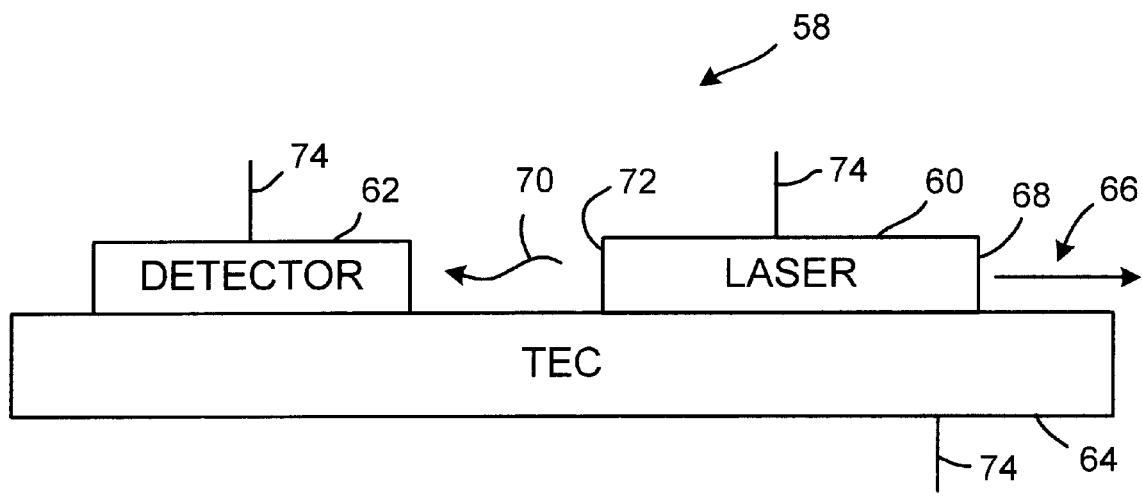
FIG. 3 is a schematic diagram of a laser diode with a backfacet monitor that may be used as a pump for an optical amplifier in accordance with the present invention.

An illustrative laser diode pump 58 that may be used as one of the laser diode pumps in pump 26 or pumps 40 of FIG. 2 is shown in FIG. 3. Pump laser 58 of FIG. 3 has a diode laser device 60, a backfacet monitor 62, and a thermoelectric cooling element (TEC) 64. Thermoelectric cooling element 64 is used to maintain laser 60 and detector 62 at a constant temperature, for example, 25 C. or a higher temperature such as 45 C. Laser 60, detector 62, and TEC 64 may be connected to control unit 54 using electrical paths such as paths 74.

Laser 60 produces pump light 66 from front facet 68. A small fraction of the light from laser 60 exits laser 60 as light 70 through back facet 72. Light 70 may also be produced by a direct reflection from light 60 or by tapping a portion of light from light 66. The power of light 70 may be measured using detector 62. The power of light 70 is approximately proportional to the power of light 66, so measuring the power of light 70 with detector 62 provides real-time information on the output power of pump 58. During operation of amplifier 18, the real-time output power information may be used to ensure that pump 58 is not driven at a power that exceeds the maximum allowable output power for laser device 60.

The real-time output power information and known drive current information may be used by control unit 54 to determine how much pump 58 has been influenced by aging effects. For example, if it is determined that pump 58 needs to be driven with 10% more current than was used at the beginning of life for the pump to produce a given operating power, the control unit may conclude that the maximum allowable drive current for the laser should be increased to a level that is 10% more than the beginning-of-life maximum drive current. The back facet monitor is, however, most accurate when a thermoelectric cooling element is used.

Figure 4:
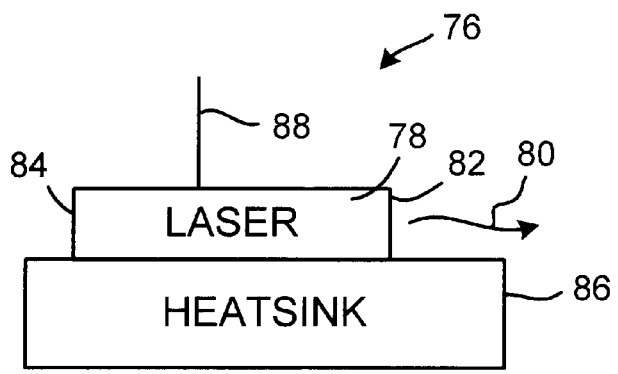
FIG. 4 is a schematic diagram of a laser diode without a backfacet monitor that may be used as a pump for an optical amplifier in accordance with the present invention.

For some optical amplifier designs, it may be too expensive or bulky to use thermoelectric cooling elements to control laser and monitor temperatures. In this type of situation, a pump 76 of the type shown in FIG. 4 may be used. Pump 76 of FIG. 4 may be used as one of the laser diode pumps in pump 26 or pumps 40 of FIG. 2. Laser device 78 may produce pump light 80 from front facet 82, but need not emit monitor light through back facet 84. Laser 78 may be mounted on a heat sink 86 or other suitable mounting structure. Control unit 54 may control pump 76 using an electrical path such as path 88. A temperature controller such as thermoelectric cooling element 64 of FIG. 3 may or may not be used with pump 76. Eliminating the thermoelectric cooling element may reduce cost. The operating characteristics of the laser such as the wavelength of the laser may drift when no temperature controller is used to control the temperature of laser 78. However, for pump applications such as rare-earth-doped fiber pump applications, very precise control of the pump wavelength need not be critical.

When a pump with an uncontrolled temperature is used in amplifier 18, real-time laser diode output power monitoring is generally not possible. Rather, control unit 54 may use date clock 56 to keep track of the age of pump 76. Date clock 56 may also be used to keep track of the age of pumps such as pump 58 of FIG. 3 (either instead of or in conjunction with using back facet monitor 62 to monitor the effects of aging). This may significantly reduce the amount of required accuracy for the back facet monitor if one is used and may therefore increase pump yield and reduce pump cost.

Figure 5:
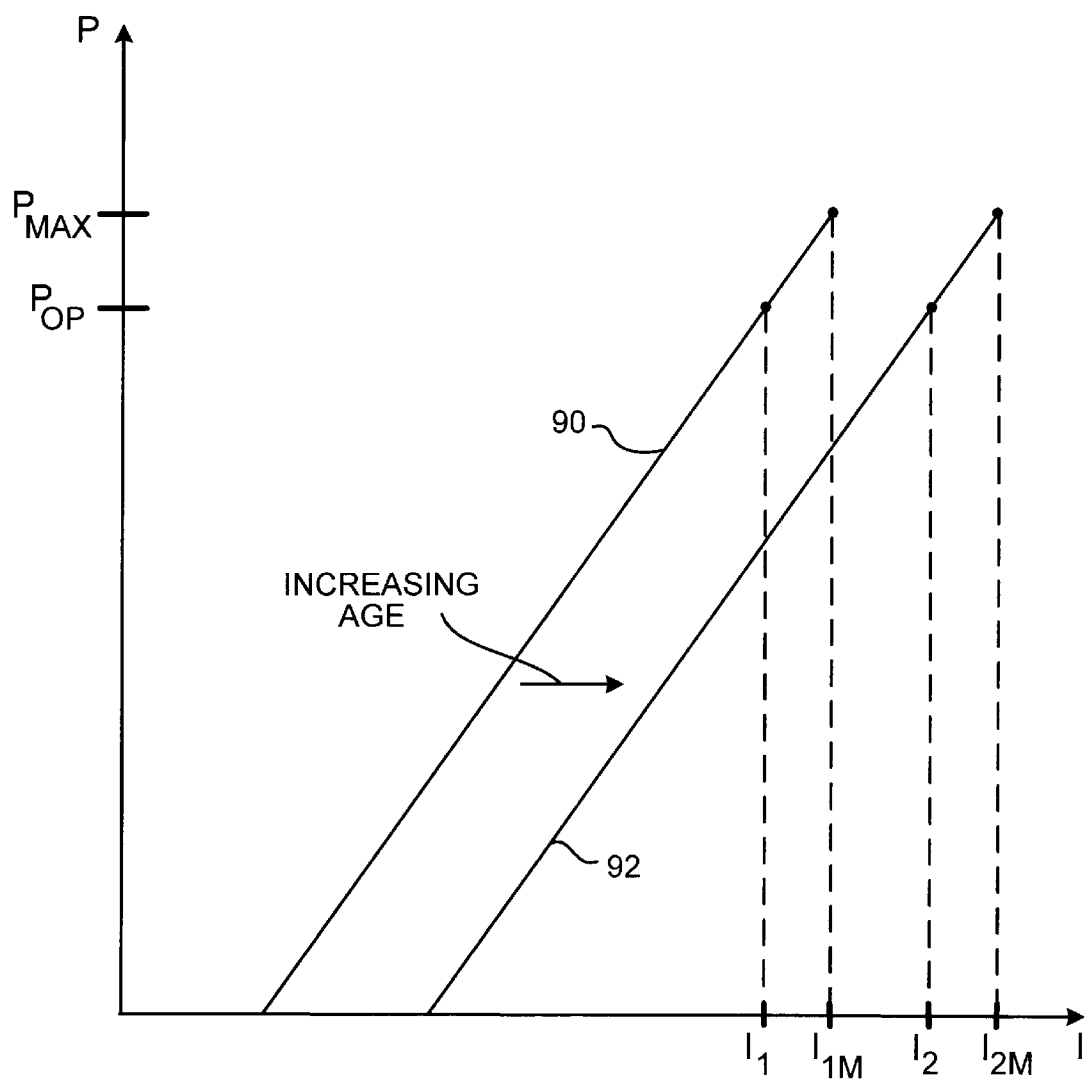
FIG. 5 is a graph showing how the drive current characteristic of a laser diode may change as the laser diode ages.

The effects of aging on the output power characteristic of a typical laser diode are shown in FIG. 5. Initially, for example, at the laser's beginning of life (BOL), the laser may have an output power versus drive current characteristic of the type shown by line 90. A diode laser may have a lifetime on the order of 15–20 years or longer when used as a pump in an optical amplifier. As the laser diode ages, the output power versus drive current characteristic may shift, as shown by line 92. For a typical optical amplifier diode pump laser, the amount of drive current needed to produce a given output power increases by about 1%/year on average.

In some situations, a pump may fail suddenly (e.g., the pump may experience a sudden 90% drop in output power). In this case, the amplifier may not be able to produce a desired output power, even when that pump is driven at its maximum allowed drive current. If desired, an output power failure alarm may be generated or other suitable actions taken that indicate the presence of a pump failure. Pump failures of this type may be detected using back facet monitors (e.g., back facet monitors which need not have high accuracy and which therefore need not be costly).

The power $P_{OP}$ in FIG. 5 represents an illustrative operating output power. The power $P_{MAX}$ represents the maximum allowed output power. If the power $P_{MAX}$ is exceeded, pump performance may deteriorate. The laser diode may also fail or may suffer from a significantly reduced lifetime. Accordingly, control unit 54 endeavors to maintain the maximum current for the laser diode low enough to ensure that the maximum output power $P_{MAX}$ is never exceeded (or is never exceeded for a sustained period of time).

When a laser diode with a back facet monitor is used, the control unit may monitor the output power of the laser diode in real time. For example, at the beginning of life, the back facet monitor may be used in real time to ensure that the current is not raised above a level that produces more than $P_{MAX}$ at the laser output. If desired, the control unit may estimate the shape of line 90 from the measured values of $P_{OP}$ and $I_1$ and may use knowledge of the shape of line 90 to prevent the drive current from exceeding current $I_{1M}$.

As the diode ages, the control unit may perform the same functions to prevent the diode from producing more than the maximum allowable output power. For example, when the laser diode ages sufficiently to move its characteristic curve from that of line 90 to that of line 92, the back facet monitor may continue to be used to make real time output power measurements to ensure that the current is not raised above a level that produces more than $P_{MAX}$ at the laser output. The control unit may also be used to estimate the shape of line 92 from the measured values of $P_{OP}$ and $I_2$ and may use knowledge of the shape of line 92 to prevent the drive current from exceeding current $I_{2M}$.

With laser diode pumps having back facet monitors, it may be difficult to use the back facet monitors to measure the ratio between emitted light such as light 66 of FIG. 3 and the tapped or backwards-traveling monitor light such as light 70 with great accuracy, particularly if the back facet monitors are not temperature controlled. Measurement inaccuracies of this type may be referred to as tracking errors. Tracking errors may make it difficult to monitor pump aging effects using only a back facet monitor. If a date clock or other arrangement is used to supply aging information that supplements readings from the back facet monitor, however, laser diode pumps having back facet monitors with loose tracking error specifications may be used. Such laser diode pumps may be simpler to fabricate and lower in cost than laser diode pumps that exhibit extremely low tracking errors.

Moreover, laser diode pumps without any back facet monitors are often less costly and less complex than other pumps. When a diode laser without a back facet monitor is used, the control unit cannot generally monitor the output power of the laser diode with great accuracy and cannot generally measure the output power of the laser diode in real time. At the beginning of life, the laser diode may be calibrated and the control unit provided with information on the shape of curve 90. Information on the expected rate of aging may also be provided to the control unit. For example, information on the expected rate at which the operating current should be increased to produce a given output power may be provided to the control unit. The rate may be, for example, 1%/year. In general, the maximum amount of allowable drive current may be increased by any suitable amount per year. For example, the maximum amount of allowable drive current may be increased by about 0.5–1.5% per year or by about 0.1% to 2.5% per year.

Figure 6:
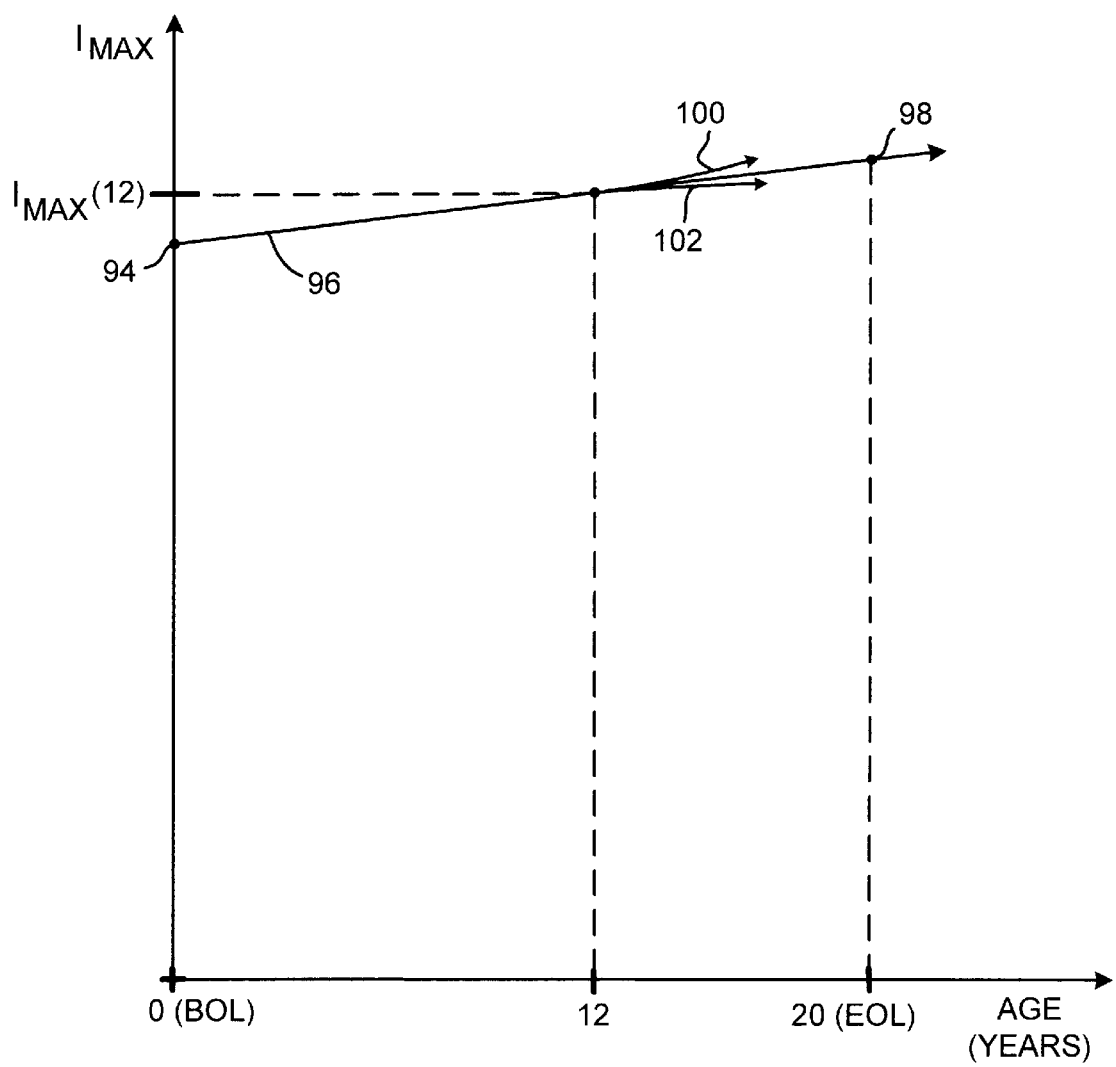
FIG. 6 is a graph showing how the maximum allowable drive current for a given laser diode may be predicted as a function of age in accordance with the present invention.

During operation, the control unit may use information on the current age of the amplifier and pumps that is gathered using date clock 56 and may use information on the predicted aging rate to ensure that the pumps are operated within appropriate limits. A graph showing how the maximum allowed current $I_{MAX}$ may be calculated as a function of measured age is shown in FIG. 6. At the beginning of life (BOL) for the laser, the maximum current may be given by point 94. During operation of the amplifier, control unit 54 may use date clock 56 to keep track of the age of the pump lasers in the amplifier. The control unit may use curve 96 (e.g., a curve that assumes a 1% increase in current per year) to determine the appropriate maximum current $I_{MAX}$ for a given laser age. For example, a laser that is 12 years old may have a maximum allowable current of $I_{MAX}(12)$. At the predicted end of life (EOL) for the laser (e.g., 20 years), the maximum current may be given by point 98. Using curve 96 to determine the maximum allowable current as a function of measured age allows the control unit to drive the pumps to their maximum allowable current levels without relying entirely on back facet monitor reading or other real-time laser output power readings. If such real-time information is available, it may be used for greater accuracy, but it is not required.

If desired, the control unit may monitor the drive current that is being used during operation of the amplifier. If the lasers are being driven at relatively high currents, the lasers may experience accelerated aging effects. Accordingly, the control unit may start to use a curve such as curve 100 when high currents are detected. If the lasers are being driven at relatively low currents, the lasers may experience reduced aging effects. Accordingly, if relatively low currents are detected, the control unit may start to use a curve such as curve 102. With this type of approach, the predicted aging rate may be a function of drive current history. Moreover, any suitable aging algorithm may be used to capture the effects of aging. The curves used by the control unit such as curves 96, 100, and 102 need not be linear functions of the measured age.

Figure 7:
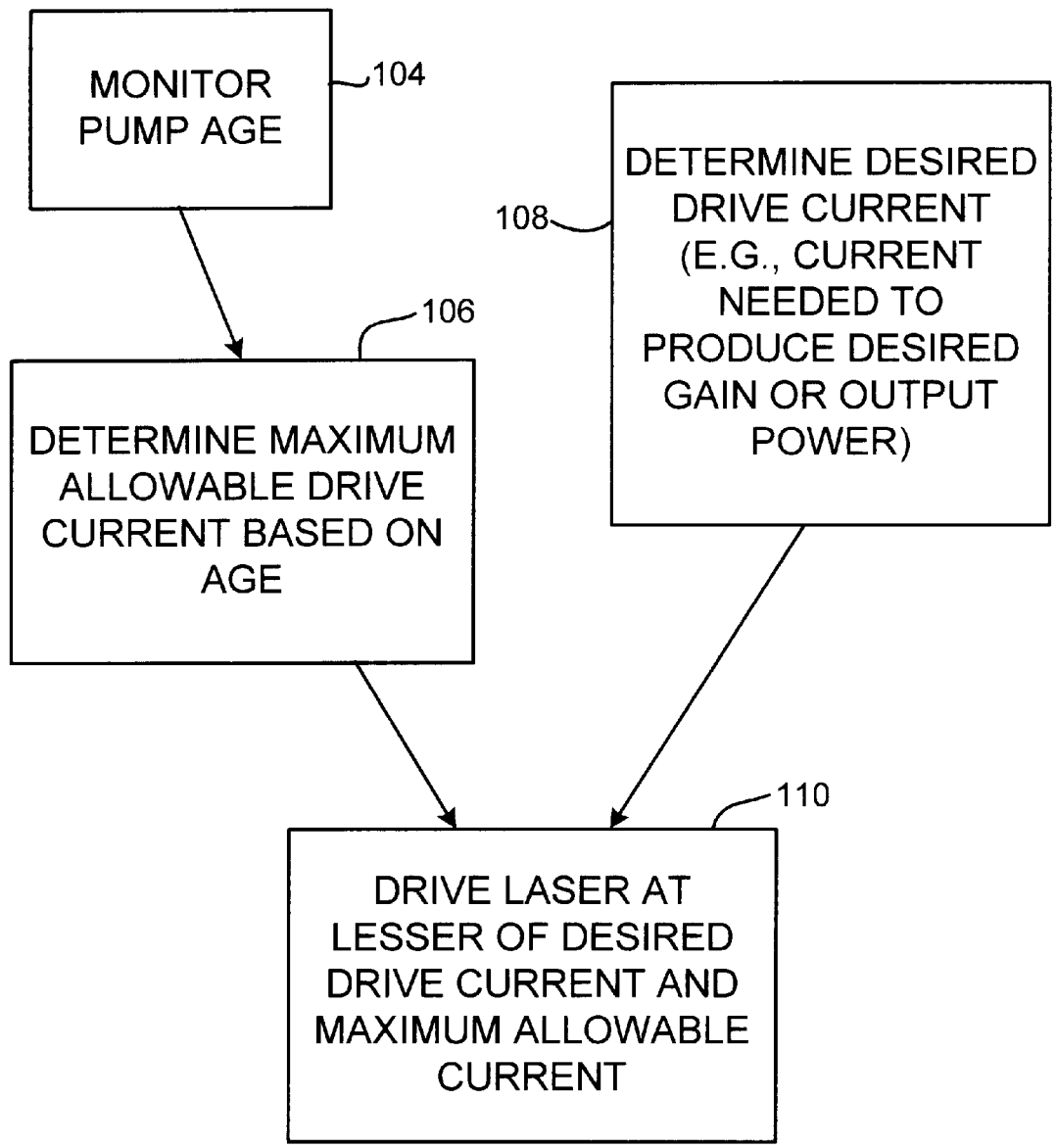
FIG. 7 is a flow chart of illustrative steps involved in controlling laser diode pumps in optical amplifiers or other network equipment based on pump age information in accordance with the present invention.

Illustrative steps involved in using laser age information in controlling amplifier 18 are shown in FIG. 7. As shown by step 104, laser diode pump age may be monitored. Any suitable age monitoring scheme may be used. For example, control unit 54 may use date clock 56 to keep track of laser diode pump age. If desired, the network management system may keep track of laser diode pump age. The network management system may make pump age information available to the amplifiers or may provide age-based information on maximum allowable pump currents to amplifiers 18. The age monitoring process illustrated by step 104 of FIG. 7 may take place continually, may take place periodically (e.g., once per day or once per other suitable time period), may take place in response to a manual or automatically-generated command, may take place when certain events occur, may take place according to a schedule, etc.

As shown by step 106, the maximum allowable drive current for the laser diode pumps may be determined, as described in connection with FIG. 6. Maximum allowable drive current calculations may be made by control unit 54 or other suitable equipment based on the age information gathered at step 104. Information on historical values of drive current may be used in determining the maximum allowable drive current if desired. Step 106 may take place continually, may take place periodically (e.g., once per day or once per other suitable time period), may take place in response to a manual or automatically-generated command, may take place when certain events occur, may take place according to a schedule, etc.

As shown by step 108, the drive current that is desired for driving each of the laser diode pumps may be determined by the control unit. For example, if the amplifier is operating in constant current mode, a requested current setting from the network management system may be used as the desired current. If the amplifier is operating in constant gain mode or in constant output power mode, a feedback control loop or other suitable control scheme may be implemented by the control unit to determine the drive current. The desired drive current may be calculated continually in real time (or periodically, etc.) during operation of this control loop or scheme. The process of determining the desired drive current for each of the pump lasers may be implemented using digital or analog control circuitry.

The drive current levels of step 108 may be calculated based on power levels measured with taps and monitors such as taps 44 and 46 and monitors 48 and 50 and settings such as settings for current, gain, output power, etc. If desired, the drive current levels of step 108 may be calculated based on age information. For example, age information may be used to select an appropriate output power versus drive current characteristic from a set of curves such as curves 96, 100, and 102 of FIG. 6. Using the age-based output power versus drive current relationships may allow amplifiers operated in constant current mode to be driven using more accurate current levels than would otherwise be possible and may improve the performance of amplifiers that are operated in constant gain mode or constant output power mode.

As shown by step 110, during operation of the amplifier (in constant current mode, constant gain mode, constant output power mode, or any other suitable mode of operation), control unit 54 may drive the pump lasers at the desired current (determined at step 108) while ensuring that the maximum current levels that are used remain below the maximum allowable drive currents determined using steps 104 and 106. In particular, each laser diode may be driven at a current that is the lesser of the desired drive current of step 108 and the maximum allowable current determined at steps 104 and 106. By limiting the maximum allowable current based on measured age information, damage to the laser diodes may be avoided.

The steps of FIG. 7 are shown as separate steps for purposes of illustration, but may be part of an integrated control scheme. Any suitable scheme may be used for controlling the operation of the laser diode pumps based on age information if desired. Age information may be used to improve the performance of the amplifiers and may be used to determine the appropriate maximum drive current to use for laser diode pumps without requiring the use of back facet monitor information or other real-time laser diode output power information. If desired, real-time output power information and information on tapped optical powers may be used in controlling the operation of the amplifiers.

It will be understood that the foregoing is merely illustrative of the principles of this invention, and that various modifications can be made by those skilled in the art without departing from the scope and spirit of the invention.

What is claimed is:

1. An optical amplifier used to amplify optical data signals in a fiber-optic communications link, comprising:
   at least one laser diode pump that is operated by applying a drive current;
   at least one fiber that is optically pumped by light from the laser diode pump to produce optical gain for the optical data signals in the link; and
   a control unit that is configured to control the drive current of the laser diode pump, wherein the control unit is configured to keep track of the age of the laser diode pump and is configured to limit the maximum amount of drive current that is used to operate the laser diode pump, and wherein the control unit is configured to determine the maximum amount of drive current based on the age of the laser diode pump.

2. The optical amplifier defined in claim 1 wherein the fiber comprises rare-earth-doped fiber.

3. The optical amplifier defined in claim 1 wherein the laser diode pump has no back facet monitor.

4. The optical amplifier defined in claim 1 wherein the laser diode pump has no temperature controller.

5. The optical amplifier defined in claim 1 wherein the laser diode pump has no back facet monitor and the laser diode pump has no temperature controller.

6. The optical amplifier defined in claim 1 wherein the control unit is configured to keep track of the date.

7. The optical amplifier defined in claim 1 wherein the laser diode pump comprises a Raman pump that produces Raman gain in the fiber.

8. The optical amplifier defined in claim 1 wherein the fiber comprises a span of transmission fiber.

9. The optical amplifier defined in claim 1 wherein the control unit is configured to determine a desired drive current level for operating the laser diode pump based at least partly on information on the age of the laser diode pump.

10. The optical amplifier defined in claim 1 wherein the laser diode pump includes a back facet monitor and does not include a temperature controller.

11. The optical amplifier defined in claim 1 wherein the laser diode pump includes a back facet monitor and a temperature controller.

12. The optical amplifier defined in claim 1 wherein the control unit is configured to add between 0.1% to 2.5% per year to the maximum allowable drive current for the diode laser pump.

13. The optical amplifier defined in claim 1 wherein the fiber comprises at least two coils of erbium-doped fiber and wherein at least two laser diode pumps are used to pump the fiber.

14. The optical amplifier defined in claim 1 wherein the laser diode pump is mounted on a heatsink without a thermoelectric cooling element, and wherein the optical amplifier further comprises at least one tap and optical monitor for measuring optical power in the optical amplifier.

15. The optical amplifier defined in claim 1 wherein the optical amplifier receives the optical data signals from a span of Raman-pumped transmission fiber, wherein the control unit is configured to control a Raman pump for pumping the Raman-pumped transmission fiber and is configured to control a rare-earth-doped fiber amplifier laser diode pump that pumps rare-earth-doped fiber, and wherein the control unit is configured to determine maximum allowable currents for the Raman pump and the rare-earth-doped fiber amplifier pump based on laser diode age information.

16. The optical amplifier defined in claim 1 wherein the control unit is configured to receive commands from a network management system.

17. The optical amplifier defined in claim 1 wherein the control unit is configured to implement a constant gain mode and a constant output power mode.

18. The optical amplifier defined in claim 1 wherein the control unit is configured to monitor the drive current level that is used to drive the laser diode pump.

19. The optical amplifier defined in claim 1 wherein the control unit is configured to monitor the drive current level that is used to drive the laser diode pump and is configured to use information on the monitored drive current level to calculate the maximum allowable drive current for the laser diode pump.

20. Optical network equipment that handles optical data signals in a fiber-optic communications link, comprising:

at least one laser diode pump that is operated by applying a drive current;

at least one fiber that is optically pumped by the laser diode pump to produce optical gain for the optical data signals in the link; and a control unit that is configured to control the drive current of the laser diode pump, wherein the control unit is configured to keep track of the age of the laser diode pump and is configured to limit the maximum amount of drive current that is used to operate the laser diode pump, and wherein the control unit is configured to calculate the maximum amount of drive current based on the age of the laser diode pump.

* * * * *